(12) United States Patent
Davenport et al.

(10) Patent No.: US 8,725,784 B2
(45) Date of Patent: May 13, 2014

(54) METHOD AND APPARATUS FOR COMPRESSIVE DOMAIN FILTERING AND INTERFERENCE CANCELLATION

(75) Inventors: Mark A. Davenport, Los Altos Hills, CA (US); Petros T. Boufounos, Boston, MA (US); Richard G. Baraniuk, Houston, TX (US)

(73) Assignee: William Marsh Rice University, Houston, TX (US)

( * ) Notice: Subject to any disclaimer, the term of this patent is extended or adjusted under 35 U.S.C. 154(b) by 421 days.

(21) Appl. No.: 13/257,481

(22) PCT Filed: Mar. 19, 2010

(86) PCT No.: PCT/US2010/027986
§ 371 (c)(1),
(2), (4) Date: Sep. 19, 2011

(87) PCT Pub. No.: WO2010/108099
PCT Pub. Date: Sep. 23, 2010

(65) Prior Publication Data
US 2012/0016921 A1    Jan. 19, 2012

Related U.S. Application Data

(60) Provisional application No. 61/161,760, filed on Mar. 19, 2009.

(51) Int. Cl.
*G06F 17/10* (2006.01)

(52) U.S. Cl.
USPC ........................................................ 708/300

(58) Field of Classification Search
None
See application file for complete search history.

(56) References Cited

U.S. PATENT DOCUMENTS

| | | | | |
|---|---|---|---|---|
| 7,271,747 B2 * | 9/2007 | Baraniuk et al. | ................ | 341/87 |
| 7,511,643 B2 * | 3/2009 | Baraniuk et al. | ................ | 341/87 |
| 7,928,893 B2 * | 4/2011 | Baraniuk et al. | ............. | 342/25 F |
| 8,199,244 B2 * | 6/2012 | Baraniuk et al. | ............. | 348/335 |
| 8,379,485 B2 * | 2/2013 | Cevher et al. | ................. | 367/128 |
| 8,483,492 B2 * | 7/2013 | Baraniuk et al. | ............. | 382/232 |
| 8,566,053 B2 * | 10/2013 | Baraniuk et al. | ................ | 702/66 |

(Continued)

OTHER PUBLICATIONS

Candès, E., Romberg, J., Tao, T., "Robust uncertainty principles: Exact signal reconstruction from highly incomplete frequency information," IEEE Trans. Inform. Theory 52 (2006) 489-509.

(Continued)

*Primary Examiner* — David H Malzahn
(74) *Attorney, Agent, or Firm* — 24IP Law Group; Timothy R DeWitt

(57) ABSTRACT

A method for compressive domain filtering and interference cancelation processes compressive measurements to eliminate or attenuate interference while preserving the information or geometry of the set of possible signals of interest. A signal processing apparatus assumes that the interfering signal lives in or near a known subspace that is partially or substantially orthogonal to the signal of interest, and then projects the compressive measurements into an orthogonal subspace and thus eliminate or attenuate the interference. This apparatus yields a modified set of measurements that can provide a stable embedding of the set of signals of interest, in which case it is guaranteed that the processed measurements retain sufficient information to enable the direct recovery of this signal of interest, or alternatively to enable the use of efficient compressive-domain algorithms for further processing. The method and apparatus operate directly on the compressive measurements to remove or attenuate unwanted signal components.

20 Claims, 5 Drawing Sheets

(56) References Cited

U.S. PATENT DOCUMENTS

| | | | |
|---|---|---|---|
| 2004/0054479 A1 | 3/2004 | Trickett | |
| 2006/0239336 A1* | 10/2006 | Baraniuk et al. | 375/216 |
| 2008/0228446 A1* | 9/2008 | Baraniuk et al. | 702/189 |
| 2010/0001901 A1* | 1/2010 | Baraniuk et al. | 342/25 F |
| 2010/0241378 A1* | 9/2010 | Baraniuk et al. | 702/66 |
| 2010/0265799 A1* | 10/2010 | Cevher et al. | 367/121 |
| 2010/0315513 A1* | 12/2010 | Goodman et al. | 348/187 |
| 2011/0025870 A1* | 2/2011 | Baraniuk et al. | 348/222.1 |
| 2012/0016921 A1* | 1/2012 | Davenport et al. | 708/322 |
| 2012/0213270 A1* | 8/2012 | Baraniuk et al. | 375/240.01 |
| 2012/0314099 A1* | 12/2012 | Kelly et al. | 348/222.1 |
| 2013/0093957 A1* | 4/2013 | Baraniuk et al. | 348/659 |

OTHER PUBLICATIONS

David Donoho, "Compressed Sensing," IEEE Transactions on Information Theory, vol. 52, Issue 4, Apr. 2006, pp. 1289-1306.

E. J. Candès and T. Tao, "Near Optimal Signal Recovery From Random Projections: Universal Encoding Strategies?" IEEE Trans. Info Theory, vol. 52, No. 12, pp. 5406-5425, 2006.

E. J. Candès, "Compressive sampling," in Proc. International Congress of Mathematicians, vol. 3, pp. 1433-1452, Madrid, Spain, 2006.

E. J. Candès and T. Tao, "Decoding by linear programming," IEEE Trans. Inform. Theory, vol. 51, pp. 4203-4215, Dec. 2005.

E. J. Candès, "The restricted isometry property and its implications for compressed sensing," in Compte Rendus de l'Academie des Sciences, Paris, Series I, vol. 346, pp. 589-592, 2008.

D. Needell and J. A. Tropp, "CoSaMP: Iterative signal recovery from incomplete and inaccurate samples," Applied and Computational Harmonic Analysis, vol. 26, No. 3, pp. 301-321, May 2009.

D. Achlioptas, "Database-friendly random projections," in Proc. Symp. Principles of Database Systems, 2001.

S. Dasgupta and A. Gupta, "An elementary proof of the Johnson-Lindenstrauss lemma," Tech. Rep. TR-99-006, Berkeley, CA, 1999.

M. A. Davenport, M. B. Wakin, and R. G. Baraniuk, "Detection and estimation with compressive measurements," Tech. Rep. TREE 0610, Rice University ECE Department, Houston, TX, 2006.

R. G. Baraniuk, M. Davenport, 15 R. A. DeVore, and M. B.Wakin, "A simple proof of the restricted isometry property for random matrices," Constructive Approximation, vol. 28, No. 3, pp. 253-263, Dec. 2008.

R. G. Baraniuk and M. B. Wakin, "Random projections of smooth manifolds," Foundations of Computational Mathematics, vol. 9, No. 1, pp. 51-77, Feb. 2009.

J. N. Laska, S. Kirolos, M. F. Duarte, T. Ragheb, R. G. Baraniuk, and Y. Massoud, "Theory and implementation of an analog-to-information conversion using random demodulation," in Proc. IEEE Int. Symposium on Circuits and Systems (ISCAS), New 10 Orleans, LA, May 2007.

S. Kirolos, J. Laska, M. Wakin, M. Duarte, D. Baron, T. Ragheb, Y. Massoud, and R. Baraniuk, "Analog-to-information conversion via random demodulation," in in Proc. IEEE Dallas Circuits and Systems Workshop (DCAS), 2006.

A. C. Gilbert, S. Muthukrishnan, and M. J. Strauss, "Improved time bounds for near-optimal sparse Fourier representations," in Proc. Wavelets XI at SPIE Optics and Photonics, San Diego, CA, Aug. 2005.

R. Shenoy, "Nonuniform sampling of signals and applications," IEEE International Symposium on Circuits and Systems (ISCAS), vol. 2, pp. 181-184, 1994.

M. F. Duarte, M. A. Davenport, M. B. Wakin, and R. G. Baraniuk, "Sparse signal detection from incoherent projections," in IEEE Int. Conf. on Acoustics, Speech and Signal Processing (ICASSP), vol. III, pp. 305-308, Toulouse, France, May 2006.

J. A. Tropp, J. N. Laska, M. F. Duarte, J. K. Romberg, and R. G. Baraniuk, "Beyond Nyquist: Efficient sampling of sparse, bandlimited signals," to appear in IEEE Transactions on Information Theory, 2010.

E. J. Candès, J. Romberg, and T. Tao, "Stable signal recovery from incomplete and inaccurate measurements," Communications on Pure and Applied Mathematics, vol. 59, No. 8, pp. 1207-1223, Aug. 2006.

A. C. Gilbert, S. Guha, P. Indyk, S. Muthukrishnan, and M. J. Strauss, "Near-Optimal Sparse Fourier Representations via Sampling," in Proc. ACM Symposium on Theory of Computing, Montreal, Canada, May 2002.

M. F. Duarte, M. A. Davenport, D. Takhar, J. N. Laska, T. Sun, K. F. Kelly, and R. G. Baraniuk, "Single pixel imaging via compressive sampling," IEEE Signal Proc. Mag., vol. 25, No. 2, pp. 83-91, Mar. 2008.

J. N. Laska, S. Kirolos, Y. Massoud, R. G. Baraniuk, A. C. Gilbert, M. Iwen, and M. J. Strauss, "Random sampling for analog-to-information conversion of wide-band signals," in Proc. IEEE Dallas Circuits and Systems Workshop (DCAS), Dallas, TX, Oct. 2006.

M. A. Davenport, M. F. 5 Duarte, M. B.Wakin, J. N. Laska, D. Takhar, K. F. Kelly, and R. G. Baraniuk, "The smashed filter for compressive classification and target recognition," in Proc. IS&T/SPIE Symposium on Electronic Imaging: Computational Imaging, vol. 6498, San Jose, CA, Jan. 2007.

C. Hegde, M.B. Wakin, and R.G. Baraniuk, "Random projections for manifold learning," in Neural Information Processing Systems (NIPS), 2007.

N. Alon, P. Gibbons, Y. Matias, and M. Szegedy, "Tracking join and self-join sizes in limited storage," in Proc. Symp. Principles of Database Systems (PODS), Philadelphia, PA, 1999.

* cited by examiner

METHOD AND APPARATUS FOR COMPRESSIVE DOMAIN FILTERING AND INTERFERENCE CANCELLATION

CROSS-REFERENCE TO RELATED APPLICATIONS

The present application claims the benefit of the filing date of U.S. Provisional Patent Application Ser. No. 61/161,760 filed by the present inventors on Mar. 19, 2009.

The aforementioned provisional patent application is hereby incorporated by reference in its entirety.

STATEMENT REGARDING FEDERALLY SPONSORED RESEARCH OR DEVELOPMENT

The present invention was made with government support under the following government grants or contracts: National Science Foundation Grant Nos. CCF-0431150, CCF-0728867, CNS-0435425, and CNS-0520280, DARPA Grant Nos. N6601-06-1-2011 and N66001-10 08-1-2065, Office of Naval Research Grant Nos. N00014-06-1-0610, N00014-07-1-0936, N00014-08-1-1067, N00014-08-1-1112 and N00014-08-1-1066, and Air Force Office of Scientific Research Grant Nos. FA9550-07-1-0301 and ARO MURI W311NF-07-1-0185. The government has certain rights in the invention.

1 BACKGROUND OF THE INVENTION

1.1 Field of the Invention

The present invention relates to methods and apparatus for processing signals to remove an undesired component or components while preserving a desired component or components. The invention further relates to methods that exploit the processed signal measurements for the purpose of performing a further processing step including but not limited to detection, classification, estimation, reconstruction, or other information exploitation. The invention is applicable to all types of "signals" and data, including but not limited to signals, images, video and other higher-dimensional data.

1.2 Brief Description of the Related Art

Interference cancellation is a widely explored topic with extensive applications in radar signal processing and both wired and wireless communications. Very often the characteristics of the interference are known and can be removed with an analog or digital linear time-invariant filter. For example, in wired communication such as DSL modems, analog or digital filters are used to remove the voice signal, which is of known bandwidth, from the input to the DSL modem. Notch filters are also used to remove the 60 Hz hum due to the power line interference.

In many applications, the characteristics of the signal are not known at the system design time, but are estimated as the system is operating. In these applications the application adapts the filters to remove the interference as necessary. For example in radar signal processing, interference comes from different spatial directions. The radar system detects this interference and modifies the array response pattern such that the array is "blind" to that particular direction, i.e., places a null in the array response function at that angle (see H. L. Van Trees, *Detection, Estimation, and Modulation Theory, Part IV: Optimum Array Processing*, John Wiley & Sons, 2002). In most of those applications, the interference cancellation is adaptive and is performed using digital processing.

In other applications the system has some control of the source of the interferer. For example, in multiuser wireless communication each user is a source of interference to the other users of the system. The system has control on each of the users through the communication protocol. In this case the system design goal is to reduce interference as much as possible.

In contrast, the present invention emphasizes the value of simple, general-purpose hardware that captures and processes all signals of interest together with the interference in a small set of compressive samples. The only known efforts towards interference cancellation with compressive measurements are noted in US Patent Application Publication 20080228446—Method and Apparatus for Signal Detection, Classification and Estimation from Compressive Measurements. This publication describes a technique for interference cancellation that is similar in spirit to the classical techniques described above, in which the signal processing system obtains an estimate of the interference and then removes this contribution from the measurements. In contrast, the present invention considers a very different form of interference cancellation in that it does not obtain a complete estimate of the interfering signal and then subtract out its contribution, but rather directly removes the interference while operating entirely in the compressive domain.

1.3 Compressive Sensing Background

1.3.1 Compressive Sensing and the Restricted Isometry Property

In the standard CS framework, a signal $x \in \mathbb{R}^N$ is acquired via the linear measurements $$y = \Phi x, \tag{1}$$

where $\Phi$ is an M×N matrix representing the sampling system and $y \in \mathbb{R}^M$ is the vector of measurements acquired. In practice, this signal might actually be a continuous signal or image, and the measurements need not be linear. For instance, the measurements could be adaptive or be processed by a nonlinear system such as a quantizer. However, for the sake of simplicity, the CS framework is described for linear, real-valued measurements. The CS theory permits the acquisition of significantly fewer samples than N, as long as the signal x is sparse or compressible in some basis (see E. Candès, J. Romberg, and T. Tao, "Robust uncertainty principles: Exact signal reconstruction from highly incomplete frequency information," *IEEE Trans. Inform. Theory*, vol. 52, no. 2, pp. 489-509, 2006; E. J. Candès, "Compressive sampling," in *Proc. International Congress of Mathematicians*, vol. 3, pp. 1433-1452, Madrid, Spain, 2006; D. L. Donoho, "Compressed sensing," *IEEE Trans. Info. Theory*, vol. 52, no. 4, pp. 1289-1306, September 2006; and E. J. Candès and T. Tao, "Decoding by linear programming," *IEEE Trans. Inform. Theory*, vol. 51, pp. 4203-4215, December 2005).

To understand precisely how many measurements are required to enable the recovery of a signal x, the properties of $\Phi$ that guarantee satisfactory performance of the sensing system are examined Candès and Tao introduced the restricted isometry property (RIP) of a matrix $\Phi$ and established its important role in CS (see E. J. Candès and T. Tao, "Decoding by linear programming," *IEEE Trans. Inform. Theory*, vol. 51, pp. 4203-4215, December 2005.) First $\Sigma_K$ is defined to be the set of all K-sparse signals in $\mathbb{R}^N$, i.e., $$\Sigma_K = \{x \in \mathbb{R}^N : \|x\|_0 \leq K\},$$

where $\|\cdot\|_0$ denotes the $l_0$ quasi-norm, which simply counts the number of non-zero entries of a vector. It can be said that a matrix $\Phi$ satisfies the RIP of order K if there exists a constant $\delta \in (0,1)$, such that $$(1-\delta)\|x\|_2^2 \leq \|\Phi x\|_2^2 \leq (1+\delta)\|x\|_2^2 \tag{2}$$

holds for all $x \in \Sigma_K$. In other words, $\Phi$ acts as an approximate isometry on the set of vectors that are K-sparse.

It is clear that if one wishes to be able to recover all K-sparse signals x from the measurements y, then a necessary condition on $\Phi$ is that $\Phi x_1 \neq \Phi x_2$ for any pair $x_1, x_2 \in \Sigma_K$ with $x_1 \neq x_2$. Equivalently, we require $\|\Phi(x_1-x_2)\|_2^2 > 0$, which is guaranteed if $\Phi$ satisfies the RIP of order 2K with constant $\delta<1$. Furthermore, the RIP also ensures that a variety of practical algorithms can successfully recover any compressible signal from noisy measurements. The following theorem, a slight modification of Theorem 1.2 from E. J. Candès, "The restricted isometry property and its implications for compressed sensing," in *Compte Rendus de l'Academie des Sciences, Paris, Series I*, vol. 346, pp. 589-592, 2008, makes this precise by bounding the recovery error of x with respect to the sampling noise and with respect to the $l_1$-distance from x to its best K-term approximation denoted $x_K$:

$$x_K = \arg\min_{x' \in \Sigma_K} \|x - x'\|_1.$$

Theorem 1. Suppose that $\Phi$ satisfies the RIP of order 2K with isometry constant satisfying $\delta < \sqrt{2}-1$. Given measurements of the form $y = \Phi x + e$, where $\|e\|_2 \leq \epsilon$, the solution to $$\hat{x} = \arg\min_{x' \in \mathbb{R}^N} \|x'\|_1 \text{ subject to } \|\Phi x' - y\|_2 \leq \epsilon \qquad (3)$$

obeys $$\|\hat{x} - x\|_2 \leq C_0 \epsilon + C_1 \frac{\|x - x_K\|_1}{\sqrt{K}},$$

where $$C_0 = 4 \frac{\sqrt{1+\delta}}{1 - (1+\sqrt{2})\delta},$$

$$C_1 = 2 \frac{1(1 - \sqrt{2})\delta}{1 - (1+\sqrt{2})\delta}.$$

Note that in practice one may wish to acquire signals that are sparse or compressible with respect to a certain sparsity basis or sparsity dictionary $\Psi$, i.e., $x = \Psi\alpha$ where $\Psi$ is represented as an N×N matrix (for the case of a basis) and $\alpha \in \Sigma_K$. In this case it would require instead that $\Phi\Psi$ satisfy the RIP, and the performance guarantee would be on a $\|\hat{\alpha}-\alpha\|_2$.

While $l_1$-minimization techniques are a powerful method for CS signal recovery, there also exist a variety of greedy algorithms that are commonly used in practice and for which performance guarantees similar to that of Theorem 1 can be established. In particular, a greedy algorithm called CoSaMP was recently shown to satisfy similar performance guarantees under slightly stronger assumptions on the RIP constants (see D. Needell and J. A. Tropp, "CoSaMP: Iterative signal recovery from incomplete and inaccurate samples," *Applied and Computational Harmonic Analysis*, vol. 26, no. 3, pp. 301-321, May 2009). Furthermore, it is often possible to demonstrate that an algorithm will be successful without requiring that $\Phi$ satisfy the RIP, but instead requiring that $\Phi$ satisfy some other property or properties. Thus, while the present discussion focuses primarily on the RIP in a preferred embodiment for ease of presentation, this should not be construed as to limit the scope of the invention.

Before discussing how one can actually obtain a matrix $\Phi$ that satisfies the RIP, observe that one can restate the RIP in a slightly more general form. If $\delta \in (0,1)$ and $U, V \subset \mathbb{R}^N$, we will say that a mapping $\Phi$ is a $\delta$-stable embedding of $(U,V)$ if $$(1-\delta)\|u-v\|_2^2 \leq \|\Phi u - \Phi v\|_2^2 \leq (1+\delta)\|u-v\|_2^2 \qquad (4)$$

for all $u \in U$ and $v \in V$. A mapping satisfying this property is also commonly called bi-Lipschitz. Observe that for a matrix $\Phi$, satisfying the RIP of order 2K is equivalent to being a $\delta$-stable embedding of $(\Sigma_K, \Sigma_K)$ or of $(\Sigma_{2K}, \{0\})$.[1] Furthermore, if the matrix $\Phi\Psi$ satisfies the RIP of order 2K then $\Phi$ is a $\delta$-stable embedding of $(\Psi(\Sigma_K), \Psi(\Sigma_K))$ or $((\Psi(\Sigma_{2K}), \{0\})$, where $\Psi(\Sigma_K) = \{x = \Psi\alpha: \alpha \in \Sigma_K\}$.

[1] In general, if $\Phi$ is a $\delta$-stable embedding of $(U,V)$, this is equivalent to it being a $\delta$-stable embedding of $(\tilde{U}, \{0\})$ where $\tilde{U} = \{u-v: u \in U, v \in V\}$. This formulation can sometimes be more convenient.

1.3.2 Random Matrix Constructions for Stable Embeddings

We now turn to the more general question of how to construct linear mappings $\Phi$ that satisfy (4) for particular sets U and V. While it is possible to obtain deterministic constructions of such operators, without loss of generality and for a simple proof of concept, it is often useful to consider random matrix constructions. The random matrices will be constructed as follows: given M and N, generate random M×N matrices $\Phi$ by choosing the entries $\phi_{i,j}$ as independent and identically distributed (i.i.d.) random variables. Two conditions on the random distribution are considered. First, for simplicity (in order to ensure a preservation of norms up to constants $1\pm\delta$) it will be supposed that the distribution will yield a matrix that is norm-preserving, i.e., $$\mathbb{E}(\phi_{ij}^2) = \frac{1}{M}. \qquad (5)$$

Note that in general, one could replace this with any variance to yield measurements that embed the sets with constants M $\mathbb{E}(\phi_{ij}^2)(1\pm\delta)$. Second, although there are many other possible choices, it is supposed that the distribution is a sub-Gaussian distribution, meaning that there exists a constant C>0 such that $$\mathbb{E}(e^{\phi_{ij}t}) \leq e^{C^2 t^2 / 2} \qquad (6)$$

for all $t \in \mathbb{R}$. This says that the moment-generating function of the distribution is dominated by that of a Gaussian distribution, which is also equivalent to requiring that tails of our distribution decay at least as fast as the tails of a Gaussian distribution. Examples of sub-Gaussian distributions include the Gaussian distribution, the Rademacher distribution, and the uniform distribution. In general, any distribution with bounded support is sub-Gaussian (see V. V. Buldygin and Yu. V. Kozachenko, *Metric Characterization of Random Variables and Random Processes*, American Mathematical Society, Providence, R.I., 2000).

The key property of sub-Gaussian random variables that will be of use in the discussion is that for any $x \in \mathbb{R}^N$, the random variable $\|\Phi x\|_2^2$ is strongly concentrated about its expected value; that is, there exists a constant c>0 that depends only on the constant C in (6) such that $$Pr(|\|\Phi x\|_2^2 - \|x\|_2^2| \geq \delta\|x\|_2^2) \leq 2e^{-cM\delta^2}, \qquad (7)$$

where the probability is taken over all M×N matrices $\Phi$ (see D. Achlioptas, "Database-friendly random projections," in *Proc. Symp. Principles of Database Systems*, 2001).

A number of results are now presented that will be use extensively in the sequel to ensure the stability of the compressive filtering and interference rejection method and apparatus of the present invention. While we state the results for random matrices, in practice a variety of pseudo-random and deterministic matrices will provide similar results.

Start by considering the simple case of wanting to have a $\delta$-stable embedding of $(U,V)$ where $U = \{u_i\}_{i=1}^{|U|}$ and $V = \{v_j\}_{j=1}^{|V|}$ are finite sets of points in $\mathbb{R}^N$. In the case where U=V, this is essentially the Johnson-Lindenstrauss (JL) lemma (see W. B Johnson and J. Lindenstrauss, "Extensions of Lipschitz mappings into a Hilbert space," in *Proc. Conf in Modern Analysis and Probability*, pp. 189-206, 1984; S. Dasgupta and A. Gupta, "An elementary proof of the Johnson-Lindenstrauss lemma," Tech. Rep. TR-99-006, Berkeley, Calif., 1999; and D. Achlioptas, "Database-friendly random projections," in *Proc. Symp. Principles of Database Systems*, 2001).

Lemma 1. Let U and V be sets of points in $\mathbb{R}^N$, Fix $\delta, \beta \in (0, 1)$. Let $\Phi$ be an M×N random matrix with i.i.d. entries chosen from a distribution that satisfies (7). If $$M \geq \frac{\ln(|U||V|) + \ln(2/\beta)}{c\delta^2} \quad (8)$$

then with probability exceeding 1−β, $\Phi$ is a δ-stable embedding of (U,V).

Now consider the case where $U = \mathcal{R}(\Psi_J)$ and $V=\{0\}$, where $\Psi_J$ is an orthonormal basis for a K-dimensional subspace of $\mathbb{R}^N$, and $\mathcal{R}(\bullet)$ denotes the range, or column span, of an operator. We wish to obtain a $\Phi$ that preserves the norm of any vector $x \in \mathcal{R}(\Psi_J)$. At first glance, this might seem very different than the setting for Lemma 8, since the former involves an uncountable point set, and the latter deals only with embedding a finite number of points. However, the dimension K bounds the complexity of this space and thus it can be characterized in terms of a finite number of points. The following lemma follows from Lemma 5.1 in R. G. Baraniuk, M. Davenport, R. A. DeVore, and M. B. Wakin, "A simple proof of the restricted isometry property for random matrices," *Constructive Approximation*, vol. 28, no. 3, pp. 253-263, December 2008.

Lemma 2. Suppose that $\Psi_J$ is an orthonormal basis for a K-dimensional subspace of $\mathbb{R}^N$. Fix $\delta, \beta \in (0, 1)$. Let $\Phi$ be an M×N random matrix with i.i.d. entries chosen from a distribution that satisfies (7). If $$M \geq 2\frac{K\ln(42/\delta) + \ln(2/\beta)}{c\delta^2} \quad (9)$$

then with probability exceeding 1−β, $\Phi$ is a δ-stable embedding of ($\mathcal{R}(\Psi_J), \{0\}$).

Now observe that one can extend this result beyond a single K-dimensional subspace to all possible subspaces of K-sparse signals, i.e., (see R. G. Baraniuk, M. Davenport, R. A. DeVore, and M. B. Wakin, "A simple proof of the restricted isometry property for random matrices," *Constructive Approximation*, vol. 28, no. 3, pp. 253-263, December 2008).

Lemma 3. Let $\Psi$ be an orthonormal basis and fix $\delta, \beta \in (0, 1)$. Let $\Phi$ be an M×N random matrix with i.i.d. entries chosen from a distribution that satisfies (7). If $$M \geq 2\frac{K\ln(42eN/\delta K) + \ln(2/\beta)}{c\delta^2} \quad (10)$$

with e denoting the base of the natural logarithm, then with probability exceeding 1−β, $\Phi$ is a δ-stable embedding of $(\Psi(\Sigma_K), \{0\})$.

A similar technique has recently been used to demonstrate that random projections also provide a stable embedding of nonlinear manifolds (see R. G. Baraniuk and M. B. Wakin, "Random projections of smooth manifolds," *Foundations of Computational Mathematics*, vol. 9, no. 1, pp. 51-77, February 2009): under certain assumptions on the curvature and volume of a K-dimensional manifold $\mathcal{M} \subset \mathbb{R}^N$, a random sensing matrix with $$M = O\left(\frac{K\log(N)}{\delta^2}\right)$$

will with high probability provide a δ-stable embedding of $\mathcal{M}, \mathcal{M}$.

Further use will be made of these connections in the following sections in order to filter out unwanted signal components directly from the compressive measurements.

1.3.3 Compressive Samplers

Compressive sensing (CS) theory opens the door for alternative acquisition and sampling systems. In particular, CS allows one to achieve sub-Nyquist sampling rates and to design new practical sampling techniques or implementations. In this section, one way in which the discrete CS framework can be extended to the analog domain is discussed along with several new acquisition modalities which exploit the theory. Such sampling modalities include random demodulation (see J. N. Laska, S. Kirolos, M. F. Duarte, T. Ragheb, R. G. Baraniuk, and Y. Massoud, "Theory and implementation of an analog-to-information conversion using random demodulation," in *Proc. IEEE Int. Symposium on Circuits and Systems (ISCAS)*, New Orleans, La., May 2007 and S. Kirolos, J. Laska, M. Wakin, M. Duarte, D. Baron, T. Ragheb, Y. Massoud, and R. Baraniuk, "Analog-to-information conversion via random demodulation," in *In Proc. IEEE Dallas Circuits and Systems Workshop (DCAS)*, 2006), an architecture based on a wideband pseudorandom modulator and a low-rate sampler, random sampling (see A. C. Gilbert, S. Muthukrishnan, and M. J. Strauss, "Improved time bounds for near-optimal sparse Fourier representations," in *Proc. Wavelets XI at SPIE Optics and Photonics*, San Diego, Calif., August 2005), an architecture based on pseudo-random non-uniform time samples, and coset sampling (see R. Shenoy, "Nonuniform sampling of signals and applications," *IEEE International Symposium on Circuits and Systems (ISCAS)*, vol. 2, pp. 181-184, 1994). Both of these systems can efficiently acquire a large class of compressible signals. Additionally, sampling from zero-crossings which can result in very low cost and low power acquisition systems, and recovery from samples that are quantized to 1-bit are discussed.

CS theory is framed in terms of discrete vectors and dictionaries, but the concepts can also be extended to continuous-time signals. The assumed model for this section is that of an analog signal x(t) that is a periodic or a finite-length signal which can be represented by its Fourier series. When the signal is also bandlimited, its samples at the Nyquist rate suffice to represent it. Under these assumptions, the discrete Fourier transform (DFT) coefficients of the regular samples of the signal are the same as the Fourier series coefficients. Such signals are referred to as Fourier-sparse or Fourier-compressible if the vector of DFT coefficients is sparse or compressible, respectively. Thus, one can assume and operate on a discretized signal, x, which consists of samples of x(t) at or faster than the Nyquist rate. While this model is used in the systems introduced in this document, similar models may be applied for other acquisition systems.

The architecture of a random demodulator is depicted in FIG. 1. The analog input x(t) is mixed with a pseudo-random square pulse of ±1 s, called the chipping sequence $p_c(t)$, which alternates between values at or faster than the Nyquist rate $N_\alpha$Hz of the input signal. The mixed signal is integrated over a time period $1/M_\alpha$ and sampled by the back-end analog-to-digital converter (ADC) at $M_\alpha$Hz $\ll N_\alpha$Hz. In practice, data is processed in time blocks of period T, and $N=N_\alpha T$ is defined as number of elements in the chipping sequence, and $M=M_\alpha T$ as number of measurements. In terms of the discretized model, this is equivalent to multiplying the signal x with a random sequence of ±1 s and then summing every N/M sequential coefficients. The key observation is that the modulator and chipping sequence operate at a fast rate, while the back-end ADC operates at a low rate. In hardware it is easier to build a high-rate modulator/chipping sequence combination than a high-rate ADC (see J. N. Laska, S. Kirolos, M. F. Duarte, T. Ragheb, R. G. Baraniuk, and Y. Massoud, "Theory and implementation of an analog-to-information conversion using random demodulation," in *Proc. IEEE Int. Symposium on Circuits and Systems (ISCAS)*, New Orleans, La., May 2007). In fact, many systems already use components of this front end for binary phase shift keying demodulation, as well as for other conventional communication schemes such as CDMA.

In simulations with real data, it is possible to sample bandwidths of 6 MHz using 1/10 of the Nyquist rate and recover the signal with blocks as small as N=256. This system can be represented by a banded matrix $\Phi$ containing N/M pseudo-random ±1 s per row, which operates on x. For example, with N=9 and M=3, such a $\Phi$ is expressed as $$\Phi = \begin{bmatrix} -1 & 1 & -1 & & & & & & \\ & & & -1 & -1 & 1 & & & \\ & & & & & & 1 & 1 & -1 \end{bmatrix}.$$

A detailed analysis has shown that the random demodulator can recover K-Fourier-sparse signals with $$M \geq CK \log(N/K+1)$$

measurements, where $C \approx 1.7$ (see J. A. Tropp, J. N. Laska, M. F. Duarte, J. K. Romberg, and R. G. Baraniuk, "Beyond Nyquist: Efficient sampling of sparse, bandlimited signals," to appear in *IEEE Transactions on Information Theory*, 2010).

One of the fundamental requirements in CS is that signals which are sparse in a dictionary $\Psi$ should be sampled with projections onto a set of functions $\Phi$ that are incoherent with $\Psi$. It is well known that the Fourier basis is maximally incoherent with the canonical basis; this has been applied to CS time-sparse signals from random subsets of its Fourier coefficients (see E. J. Candès and T. Tao, "Near Optimal Signal Recovery From Random Projections: Universal Encoding Strategies?" *IEEE Trans. Info Theory*, vol. 52, no. 12, pp. 5406-5425, 2006). Equivalently, random subsets of the identity matrix, i.e., non-uniform random time samples, provide enough information to recover Fourier-sparse signals using CS. For example, with N=9 and M=3, one such resulting matrix $\Phi$ is $$\Phi = \begin{bmatrix} 1 & 0 & 0 & 0 & 0 & 0 & 0 & 0 & 0 \\ 0 & 0 & 0 & 1 & 0 & 0 & 0 & 0 & 0 \\ 0 & 0 & 0 & 0 & 0 & 1 & 0 & 0 & 0 \end{bmatrix}.$$

Such a system can be implemented in several ways. One implementation may include a high-rate Nyquist sampler that does not transmit or store all of the samples. Alternatively, random sampling can be implemented as a bank of parallel low-rate samplers potentially at different rates and out of phase with each other.

Non-uniform pseudo-random sampling has been studied in other contexts outside of the CS framework. For example, there exist specialized fast algorithms for recovery of extremely large Fourier-sparse signals. The algorithm uses samples obtained from a structured non-uniform scheme based on random seeds, and it provides guarantees similar to those available from standard CS (see A. C. Gilbert, S. Muthukrishnan, and M. J. Strauss, "Improved time bounds for near-optimal sparse Fourier representations," in *Proc. Wavelets XI at SPIE Optics and Photonics*, San Diego, Calif., August 2005 and A. C. Gilbert, S. Guha, P. Indyk, S. Muthukrishnan, and M. J. Strauss, "Near-Optimal Sparse Fourier Representations via Sampling," in *Proc. ACM Symposium on Theory of Computing*, Montreal, Canada, May 2002).

2 SUMMARY OF THE INVENTION

An N-dimensional signal can be efficiently captured and recovered using $M \ll N$ randomized linear measurements provided that the signal can be sparsely expressed in a known basis or frame (see E. J. Candès, "Compressive sampling," in *Proc. International Congress of Mathematicians*, vol. 3, pp. 1433-1452, Madrid, Spain, 2006 and D. L. Donoho, "Compressed sensing," *IEEE Trans. Info. Theory*, vol. 52, no. 4, pp. 1289-1306, September 2006). This has motivated a number of practical hardware designs that enable efficient acquisition of sparse signals at the expense of a slight increase in the computation required to recover the signal (see M. F. Duarte, M. A. Davenport, D. Takhar, J. N. Laska, T. Sun, K. E Kelly, and R. G. Baraniuk, "Single pixel imaging via compressive sampling," *IEEE Signal Proc. Mag.*, vol. 25, no. 2, pp. 83-91, March 2008; J. N. Laska, S. Kirolos, Y. Massoud, R. G. Baraniuk, A. C. Gilbert, M. Iwen, and M. J. Strauss, "Random sampling for analog-to-information conversion of wideband signals," in *Proc. IEEE Dallas Circuits and Systems Workshop (DCAS)*, Dallas, Tex., October 2006; and J. A. Tropp, J. N. Laska, M. F. Duarte, J. K. Romberg, and R. G. Baraniuk, "Beyond Nyquist: Efficient sampling of sparse, bandlimited signals," to appear in *IEEE Transactions on Information Theory*, 2010).

The compressive measurements acquired by these systems will often be affected by undesired interference. Since CS-based signal acquisition and processing has been shown to be more susceptible to noise and interference than classical methods (see E. J. Candès, J. Romberg, and T. Tao, "Stable signal recovery from incomplete and inaccurate measurements," *Communications on Pure and Applied Mathematics*, vol. 59, no. 8, pp. 1207-1223, August 2006), it therefore may be desirable to eliminate as much noise and interference as possible prior to any processing.

In one preferred embodiment, the present invention is an efficient method for processing compressive measurements in order to eliminate or attenuate the interference while preserving or approximately preserving the information or geometry of the set of possible signals of interest. In a preferred embodiment, a signal processing apparatus assumes that the interfering signal lives in or near a known subspace that is orthogonal to the signal of interest, and then projects the compressive measurements into an orthogonal subspace and thus eliminates or attenuates the interference. This apparatus yields a modified set of measurements that can provide a stable embedding of the set of signals of interest, in which case it is guaranteed that the processed measurements retain sufficient information to enable the direct recovery of this signal of interest, or alternatively to enable the use of efficient compressive-domain algorithms for further processing.

In another preferred embodiment, a signal processing apparatus assumes that the signal of interest lives in or near a known subspace, but that the support of the interference is unknown. In this case the interference can be removed or attenuated regardless of the subspace in which it lives.

In another preferred embodiment, the present invention is a method and apparatus for CS filtering and interference cancelation that operates directly on the compressive measurements to remove or attenuate unwanted signal components. The practical advantages include the following. Since the interference is removed or attenuated from the compressive measurements, the signal of interest can be recovered with either fewer measurements or it can be recovered with greater fidelity. No signal recovery is required, which enables this approach to interface directly with compressive-domain signal detection, classification, estimation, and other inference methods. (See, for example, M. F. Duarte, M. A. Davenport, M. B. Wakin, and R. G. Baraniuk, "Sparse signal detection from incoherent projections," in *IEEE Int. Conf. on Acoustics, Speech and Signal Processing (ICASSP)*, vol. III, pp. 305-308, Toulouse, France, May 2006, M. A. Davenport, M. B. Wakin, and R. G. Baraniuk, "Detection and estimation with compressive measurements," Tech. Rep. TREE 0610, Rice University ECE Department, Houston, Tex., 2006, and M. A. Davenport, M. F. Duarte, M. B. Wakin, J. N. Laska, D. Takhar, K. F. Kelly, and R. G. Baraniuk, "The smashed filter for compressive classification and target recognition," in *Proc. IS&T/SPIE Symposium on Electronic Imaging: Computational Imaging*, vol. 6498, San Jose, Calif., January 2007.) Algorithm running times for inference and recovery are reduced due to the removal of the interference.

In a preferred embodiment, the present invention is a method for removing or attenuating undesired components from a set of measurements while preserving information contained in the measurements concerning the components of interest. A signal is comprised of a signal of interest added to an interference signal. The signal of interest resides in or near a first set of signals and the interference resides in or near a second set of signals, wherein elements of the second set are partially, substantially or wholly orthogonal to elements of the first set. The first set of signals, for example, may be a union of subspaces and the second set may be a subspace, or vice versa. The method is comprised of the steps of obtaining compressive measurements of the signal and processing the compressive measurements to eliminate the interference. The compressive measurements may be comprised of a dimensionality reduction from a higher dimensional space to a lower dimensional space. The step of obtaining compressive measurements may be comprised of the step of obtaining compressive measurements by a random or pseudorandom projection operator or by a valid compressive sensing matrix. The step of processing the compressive measurements to eliminate or attenuate the interference may comprise projecting or approximately projecting the measurements onto a subspace. The step of projecting the measurements may be performed by applying a projection matrix to the measurements, by an iterative algorithm, or by processing the measurements so that the lie near a subspace.

When first set of signals is a union of subspaces and the second set is a subspace, the second subspaces may be partially, substantially, or wholly orthogonal to the first subspace. In another embodiment, the first set of signals is a finite dictionary of signals and the second set is a subspace.

In yet another embodiment, the first set of signals may follow a parametric model and the second set may be a subspace or vice versa. Alternatively, both sets may simultaneously follow different parametric models.

In still another embodiment, the present invention is a method for signal acquisition in the presence of interference. The method comprises the steps of obtaining compressive measurements of a signal, the signal comprising a signal of interest and interference, the signal of interest residing in or near a first set of signals and the interference residing in or near a second set of signals, wherein elements of the second set are partially orthogonal to elements of the first set, processing the compressive measurements to eliminate or attenuate the interference, and reconstructing the signal of interference.

In another embodiment, the present invention is a method for detecting the presence or absence of a signal of interest in the presence of interference. The method comprises the steps of obtaining compressive measurements of a signal, the signal comprising a signal of interest and interference, the signal of interest residing in or near a first set of signals and the interference residing in or near a second set of signals, wherein elements of the second set are partially orthogonal to elements of the first set, processing the compressive measurements to eliminate or attenuate the interference, and detecting the presence or absence of the signal of interest.

In another embodiment, the present invention is a method for classifying a signal of interest in the presence of interference. The method comprises the steps of obtaining compressive measurements of a signal, the signal comprising a signal of interest and interference, the signal of interest residing in or near a first set of signals and the interference residing in or near a second set of signals, wherein elements of the second set are partially orthogonal to elements of the first set, processing the compressive measurements to eliminate or attenuate the interference, and classifying the signal of interest.

In another embodiment, the present invention is a method for estimating a function of a signal of interest in the presence of interference. The method comprises the steps of obtaining compressive measurements of a signal, the signal comprising a signal of interest and interference, the signal of interest residing in or near a first set of signals and the interference residing in or near a second set of signals, wherein elements of the second set are partially orthogonal to elements of the first set, processing the compressive measurements to eliminate or attenuate the interference, and estimating the value of the function that is consistent with the processed measurements.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

3 BRIEF DESCRIPTION OF THE DRAWINGS

For a more complete understanding of the present invention and the advantages thereof, reference is now made to the following description and the accompanying drawings, in which.

Figure 8:
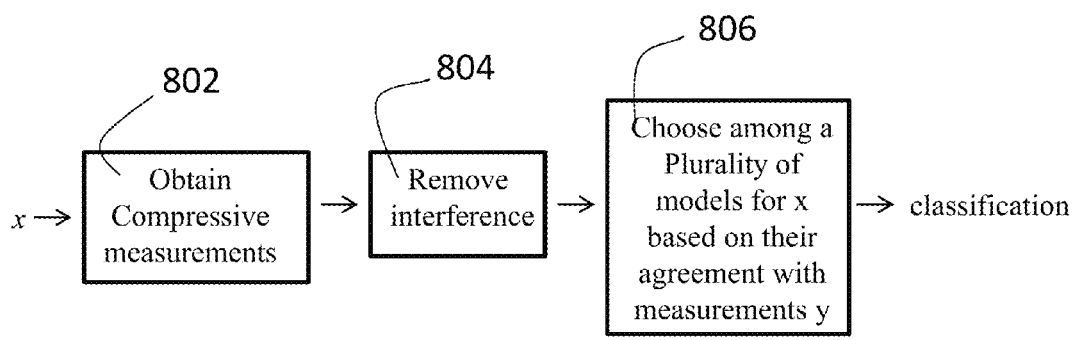

FIG. 8 is a drawing of an example system that obtains compressive measurements of a signal contaminated with interference, then processes the data to remove the contribution of the interference to the measurements, and then further processes the data to determine which among a plurality of models for the signal best agrees with the measurements. The system then classifies the signal according to which model was selected.

Figure 9:
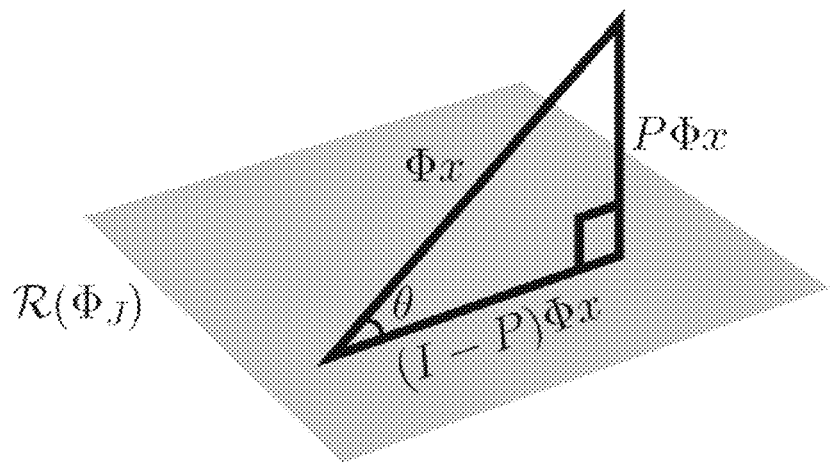

FIG. 9 illustrates the decomposition of the measurements $\Phi x$ into $P\Phi x$ and $(I-P)\Phi x$.

Figure 10:
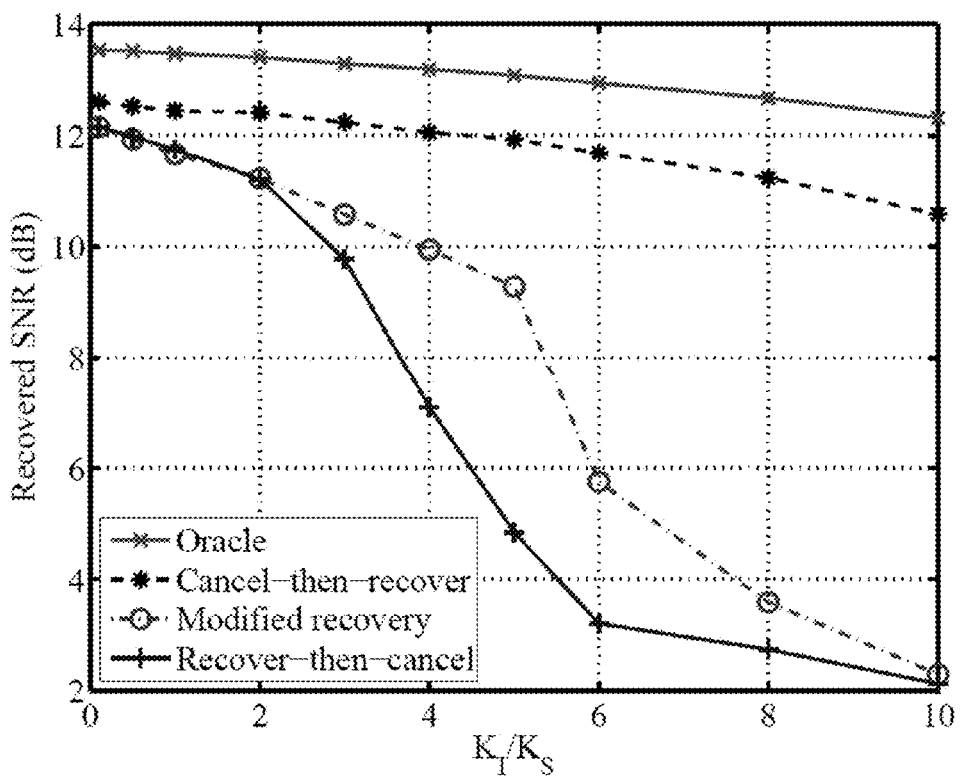

FIG. 10 shows the SNR of $x_S$ recovered using the three different cancellation approaches for different ratios of $K_I$ to $K_S$ compared to the performance of an oracle.

Figure 11:
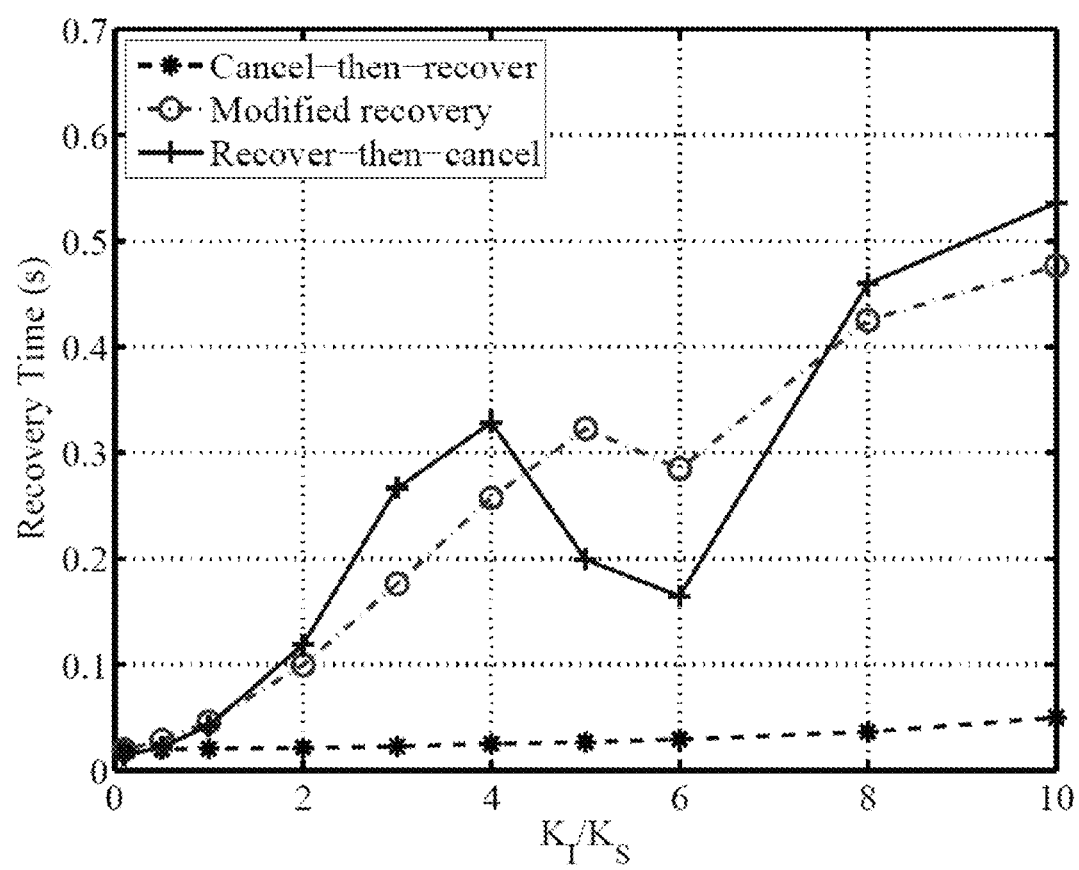

FIG. 11 shows the recovery time for the three different cancellation approaches for different ratios of $K_I$ to $K_S$.

4 DETAILED DESCRIPTION OF THE PREFERRED EMBODIMENTS

4.1 Compressive Domain Interference Cancellation

Figure 1:
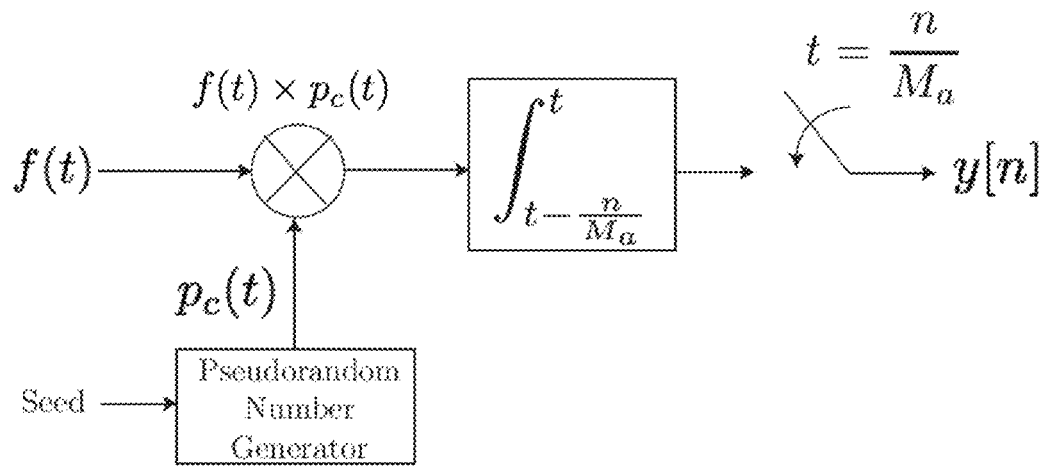
FIG. 1 is a drawing of an example device that acquires a compressive set of measurements by modulating the input signal with a pseudo-random pulse, integrating over short time windows, and then sampling at a low rate.
Figure 2:
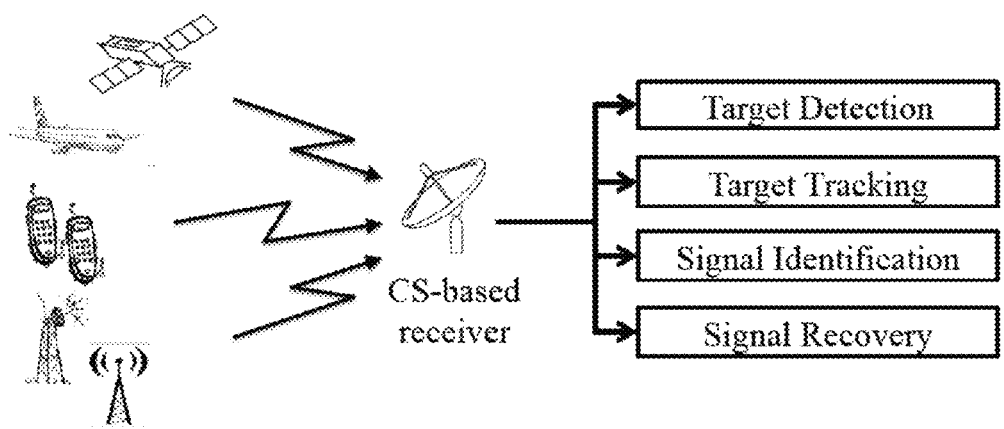
FIG. 2 is a drawing that illustrates a signal monitoring station that observes the composition of a plurality of signals and must process this data using multiple possible processing methods.

In many applications the aim is to acquire or monitor a class of structured, high-dimensional signals. Such cases are often amenable to CS-based acquisition. For example, consider the wide-band signal monitoring and processing station shown in FIG. 2 that receives signals from a variety of sources, including various television, radio, and cell-phone transmissions, radar signals, and satellite communication signals.

Figure 3:
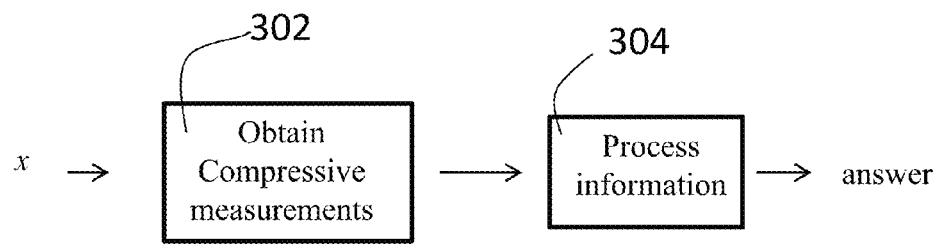
FIG. 3 is a drawing of an example system that obtains compressive measurements of a signal and then processes the data to solve the desired problem.

In many cases, the monitoring station (or a particular signal processing apparatus or method) is only interested in a subset of the signals present, and the other signals act as interference. A naïve way to proceed would be to recover all of the signal components using a standard CS algorithm (such as $l_1$-minimization or a greedy algorithm), separate the components due to each of the sources, and then process each recovered component separately. However, this approach is inherently wasteful and is often extremely suboptimal. In particular, if the goal is to obtain compressive measurements (302) and simply process the measurements (304) in order to extract some limited amount of information as in FIG. 3, then reconstructing the signal with the interference could lead to poor performance at a high computation cost. For the purpose of extracting information from the measurements other than a full reconstruction, it is usually both possible and advantageous to do so by directly operating on the compressive measurements. For example, the problems of detecting the satellite signal, tracking an airplane trajectory, or classifying a cell-phone signal could be amenable to a variety of compressive-domain processing techniques (see M. A. Davenport, M. B. Wakin, and R. G. Baraniuk, "Detection and estimation with compressive measurements," Tech. Rep. TREE 0610, Rice University ECE Department, Houston, Tex., 2006; M. A. Davenport, M. F. Duarte, M. B. Wakin, J. N. Laska, D. Takhar, K. F. Kelly, and R. G. Baraniuk, "The smashed filter for compressive classification and target recognition," in *Proc. IS&T/SPIE Symposium on Electronic Imaging: Computational Imaging*, vol. 6498, San Jose, Calif., January 2007; and C. Hegde, M. B. Wakin, and R. G. Baraniuk, "Random projections for manifold learning," in *Neural Information Processing Systems (NIPS)*, 2007).

Unfortunately, it is typically more difficult to apply compressive-domain processing techniques when several signals are acquired simultaneously, since the signals that are not of interest become sources of noise and interference. For example, the presence of a strong television signal might interfere with our ability to detect a weak signal of interest, especially in the compressive domain. In general, interference can significantly affect the performance of algorithms for compressive detection, classification, and estimation (see M. A. Davenport, M. B. Wakin, and R. G. Baraniuk, "Detection and estimation with compressive measurements," Tech. Rep. TREE0610, Rice University ECE Department, 2006), as well as our ability to reconstruct the signal of interest. It is therefore desirable to remove unwanted signals or signal components from the compressive measurements before they are processed further.

Figure 4:
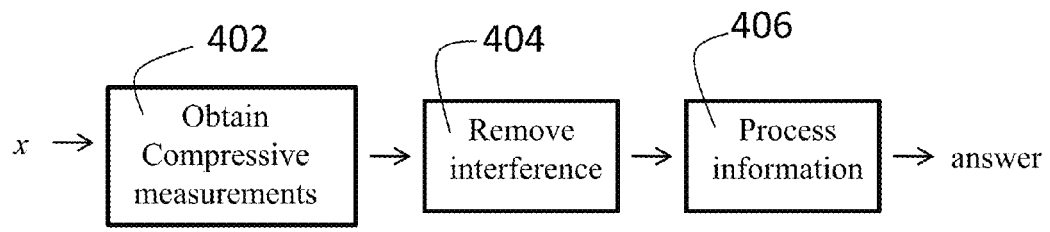
FIG. 4 is a drawing of an example system that obtains compressive measurements of a signal contaminated with interference, then processes the data to remove the contribution of the interference to the measurements, and then further processes the data to solve the desired problem.
Figure 5:
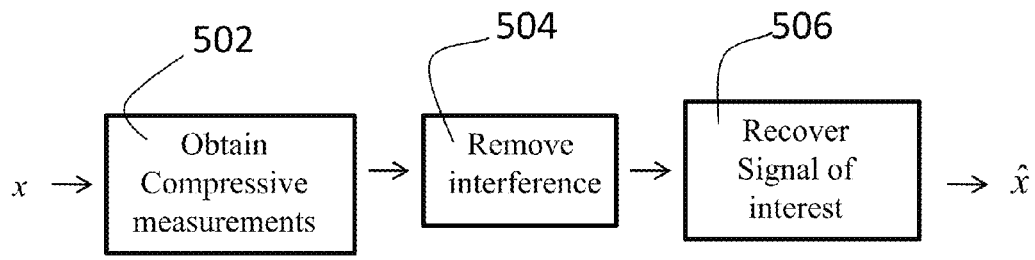
FIG. 5 is a drawing of an example system that obtains compressive measurements of a signal contaminated with interference, then processes the data to remove the contribution of the interference to the measurements, and then further processes the data to recover the signal.
Figure 6:
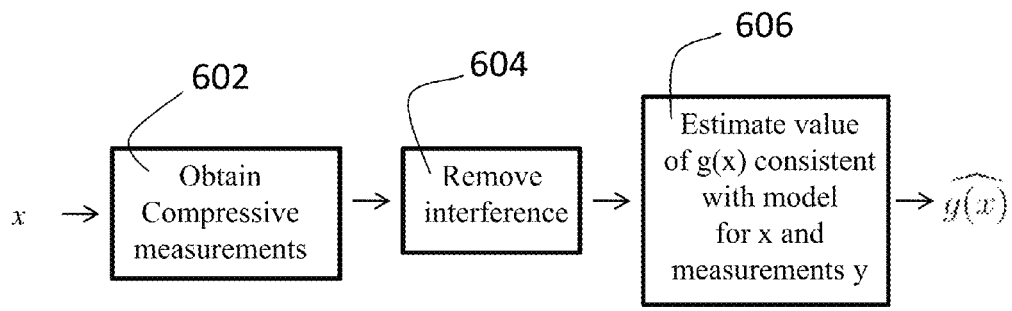
FIG. 6 is a drawing of an example system that obtains compressive measurements of a signal contaminated with interference, then processes the data to remove the contribution of the interference to the measurements, and then further processes the data to estimate the value of a function of the signal.
Figure 7:
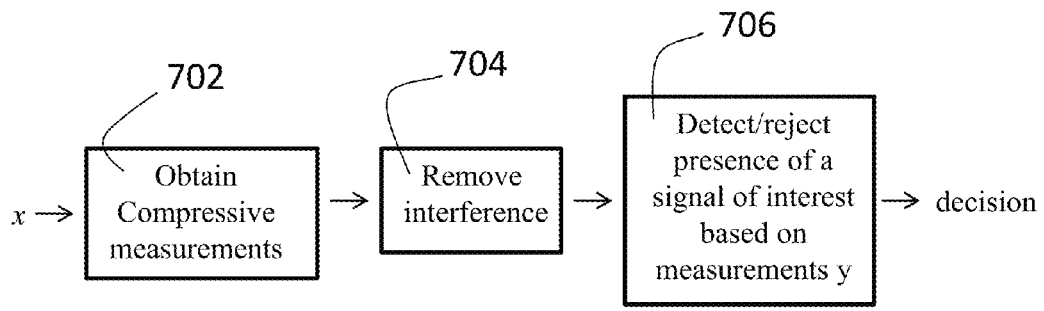
FIG. 7 is a drawing of an example system that obtains compressive measurements of a signal contaminated with interference, then processes the data to remove the contribution of the interference to the measurements, and then further processes the data to detect or reject the presence of a signal of interest in the signal.

The present invention is an efficient compressive domain filtering method and apparatus that eliminates or reduces signal interference while the preserving information in and geometry of the set of possible signals of interest as much as is feasible. As an example, if the interfering signal lives in or near a known subspace that is orthogonal to the signal of interest, then our invention can project the compressive measurements into an orthogonal subspace and thus eliminate or attenuate the interference. Thus, the measurements are obtained (402), the interference is removed or attenuated (404), and then the information is processed (406). The projection operator maintains a stable embedding for the set of signals of interest, thus the projected measurements retain sufficient information to enable the direct extraction of information, as in FIG. 4. The information extracted could entail the full recovery of this signal of interest, as in FIG. 5, such that the compressive measurements are obtained (502), the interference is removed or attenuated (504), and the signal of interest is recovered (506). Alternatively, the information extracted could consist of the estimation of some function of the signal as in FIG. 6, such that the compressive measurements are obtained (602), the interference is removed or attenuated (604), and the function is estimated (606). In another embodiment, the information extracted could be the detection of the presence or absence of signal of interest as in FIG. 7, such that the compressive measurements are obtained (702), the interference is removed or attenuated (704), and the presence of a signal of interest is detected (706). In yet another embodiment, the information extracted could be the classification of the signal into one of a plurality of categories as in FIG. 8, such that the compressive measurements are obtained (802), the interference is removed or attenuated (804), and the signal of interest is detected (806) and the signal is classified.

More formally, we suppose that our signal $x \in \mathbb{R}^N$ consists of two components:

$$x = x_S + x_I,$$

where $x_S$ represents the signal of interest and $x_I$ represents an unwanted signal that we would like to reject or attenuate. Note that here $x_I$ could represent the composition of several interference components. Furthermore, depending on the context, certain system components might view different signal components as interference. We refer to $x_I$ as interference in the remainder of this section, although it might be the signal of interest in a different system component. Supposing we acquire measurements of both components simultaneously $$y = \Phi(x_S + x_I),\qquad(11)$$

our goal is to remove or attenuate the contribution of $x_I$ to the measurements y while preserving the information about $x_S$. To begin with, we will assume that $x_I$ lies in a known $K_I$-dimensional subspace of $\mathbb{R}^N$ with basis denoted by $\Psi_J$, and we will assume that $x_S \in S$ for a general set S. In the following, we will assume that $\Phi$ is a $\delta$-stable embedding of $(S, \Psi_J)$. However, this assumption is primarily for ease in presentation of the preferred embodiment.

4.2 Compressive Domain Interference Cancellation and Stable Embeddings

We begin by mathematically establishing a result that demonstrates that the a $\delta$-stable embedding will preserve inner products between vectors.

Theorem 2. Suppose that $u \in U$ and $v \in V$ and that $\Phi$ is an $\delta$-stable embedding of $(U, V)$, then $$|\langle \Phi u, \Phi v \rangle - \langle u, v \rangle| \le \delta \|u\|_2 \|v\|_2.\qquad(12)$$

Proof. We first assume that $\|u\|_2 = \|v\|_2 = 1$. From the fact that $$\|u \pm v\|_2^2 = \|u\|_2^2 + \|v\|_2^2 \pm 2\langle u, v \rangle = 2 \pm 2\langle u, v \rangle$$

and since $\Phi$ is an $\delta$-stable embedding, we have that $$1 - \delta \le \frac{\|\Phi u \pm \Phi v\|_2^2}{2 \pm 2\langle u, v \rangle} \le 1 + \delta.$$

From the parallelogram identity we obtain $$|\langle \Phi u, \Phi v \rangle| \le \frac{1}{4} |\|\Phi u + \Phi v\|_2^2 - \|\Phi u - \Phi v\|_2^2| \le$$

$$\frac{(1 + \langle u, v \rangle)(1 + \delta) - (1 - \langle u, v \rangle)(1 - \delta)}{2} = \delta + \langle u, v \rangle.$$

Similarly, one can show that $|\langle \Phi u, \Phi v \rangle| \le \delta - \langle u, v \rangle$, and thus from the bilinearity of the inner product the lemma follows for u, v with arbitrary norm.

In the case where $|U| = 1$ and $|V| = 1$, Theorem 2 is essentially the same (up to a constant) as abound in N. Alon, P. Gibbons, Y. Matias, and M. Szegedy, "Tracking join and self-join sizes in limited storage," in *Proc. Symp. Principles of Database Systems (PODS)*, Philadelphia, Pa., 1999 which uses $\Phi$ with 4-wise independent $\{+1, -1\}$-valued entries, yielding the result that with probability at least $1-\beta$.

$$\left| \frac{1}{M} \langle \Phi u, \Phi v \rangle - \langle u, v \rangle \right| \le \frac{2}{\sqrt{\beta}} \frac{\|x\|_2 \|s\|_2}{\sqrt{M}}.\qquad(13)$$

The proof of this result, while quite elementary, relies heavily on the special structure of the matrices considered (see N. Alon, P. Gibbons, Y. Matias, and M. Szegedy, "Tracking join and self-join sizes in limited storage," in *Proc. Symp. Principles of Database Systems (PODS)*, Philadelphia, Pa., 1999). In light of Theorem 2, we can see that this bound actually holds for a significantly wider class of matrices.

We now turn to the design of operators P that operate on the measurements y to filter out the interference. In one preferred embodiment, the design of P is based solely on the measurement matrix $\Phi$ and knowledge that $x_I \in \mathcal{R}(\Psi_J)$. Note that $\Phi x_I \in \mathcal{R}(\Phi \Psi_J)$. The operator P we construct should map $\mathcal{R}(\Phi \Psi_J)$ to a small value. In one preferred embodiment, we set this value to zero, in which case this is equivalent to stating that the nullspace of P to should be equal to $\mathcal{R}(\Phi \Psi_J)$.

There are a variety of methods for constructing a P with this nullspace. Furthermore, each construction might be computed with several numerical methods, which affect the performance and stability of the construction. For example, in one preferred embodiment of the invention, $\tilde{\Phi}_J$ is any orthonormal basis for $\mathcal{R}(\Phi \Psi_J)$. Then $$P = I - \tilde{\Phi}_J \tilde{\Phi}_J^T$$

is an orthogonal projection whose nullspace is equal to $\mathcal{R}(\Phi \Psi_J)$. One could obtain $\tilde{\Phi}_J$ via Gram-Schmidt orthogonalization of the columns of $\Phi \Psi_J$ or via the singular value decomposition of $\Phi \Psi_J$ (see L. N. Trefethen and D. Bau, *Numerical Linear Algebra*, SIAM Review, 1997). We stress that there is a tremendous variety of techniques for constructing such a projection matrix, but they are all equivalent to the above preferred embodiment. Furthermore, while these techniques might theoretically have very different numerical properties, in practice they are likely to all perform equally well due to the well-conditioned nature of the problem at hand.

For example, consider yet another preferred embodiment of the invention where $\Phi$ admits a fast transform-based implementation; the projection P we construct leverages the structure of $\Phi$ and eases the computational cost of applying it. For example, $\Phi$ could consist of random rows of a Discrete Fourier Transform (DFT) or a permuted Hadamard Transform matrix. In this case, rather than constructing the matrix $\tilde{\Phi}_J$, we use $$P = I - (\Phi \Psi_J)(\Phi \Psi_J)^\dagger,$$

where $(\Phi \Psi_J)^\dagger = (\Psi_J^T \Phi^T \Phi \Psi_J)^{-1} \Psi_J^T \Phi^T$ is the pseudoinverse of $\Phi \Psi_J$. Note that since $\Phi x_I \in \mathcal{R}(\Phi \Psi_J)$ there exists an $\alpha \in \mathbb{R}^{K_I}$ (such that $$\begin{aligned} P\Phi x_I &= P\Phi \Psi_J \alpha \qquad(14)\\ &= (I - \Phi \Psi_J (\Psi_J^T \Phi^T \Phi \Psi_J)^{-1} \Psi_J^T \Phi^T) \Phi \Psi_J \alpha \\ &= \Phi \Psi_J \alpha - \Phi \Psi_J \alpha \\ &= 0. \end{aligned}$$

Thus for any $x_I$ supported on the set J, $P\Phi x_I=0$, i.e., P eliminates the interference $x_I$ from the samples y. However, unlike the prior construction, if we have a fast transform-based implementation of $\Phi$ and $\Phi^T$, then we can use the conjugate gradient method or Richardson iteration to efficiently compute Py (see D. Needell and J. A. Tropp, "CoSaMP: Iterative signal recovery from incomplete and inaccurate samples," *Applied and Computational Harmonic Analysis*, vol. 26, no. 3, pp. 301-321, May 2009).

From (11) and (14), $Py=P\Phi x_S+P\Phi x_I=P\Phi x_S$. We now need to ensure that $P\Phi x_S$ contains sufficient information about $x_S$. In particular, we wish to show that the matrix $P\Phi$ maintains a stable embedding of the signals of interest. From Theorem 2, any sparse signal that is orthogonal to $x_I$ will remain nearly orthogonal to $\Phi x_I$ in the compressive domain. Using this result we can show that if $\Phi$ is a δ-stable embedding of $(S,\Psi_J)$, then $P\Phi$ is a 2δ-stable embedding of $(\tilde{S}\{0\})$, where $\tilde{S}=\{s\in S: \Psi_J s=0\}$, i.e., $\tilde{S}$ is S restricted to the orthogonal complement of $\mathcal{R}\Psi_J$.

Theorem 3. Suppose that $\Phi$ is a δ-stable embedding of (S, $\Psi_J$), where $\Psi_J$ is a basis for a $K_J$-dimensional subspace of $\mathbb{R}^N$. If $$P=I-\Phi\Psi_J(\Phi\Psi_J)^\dagger,$$

then $P\Phi$ is a 2δ-stable embedding of $(\tilde{S},\{0\})$.

Proof. We first suppose that $x\in S$ and $\Psi_J x=0$. We can decompose $\Phi x$ as $\Phi x=P\Phi x+(I-P)\Phi x$. Since P is an orthogonal projection we can write $$\|\Phi x\|_2^2 = \|P\Phi x\|_2^2 + \|(I-P)\Phi x\|_2^2. \quad (15)$$

This is illustrated in FIG. 9. Our goal is to show that $\|\Phi x\|_2 \approx \|P\Phi x\|_2$, or equivalently that $\|(I-P)\Phi x\|_2$ is small. Towards this end, note that if θ is the angle between $\Phi x$ and $(I-P)\Phi x$, then $$\cos\theta = \frac{\|(I-P)\Phi x\|_2}{\|\Phi x\|_2} = \frac{\langle(I-P)\Phi x, \Phi x\rangle}{\|(I-P)\Phi x\|_2\|\Phi x\|_2}. \quad (16)$$

Note that (I−P) is a projection onto $\mathcal{R}(\Phi\Psi_J)$. Thus there exists an α such that $(I-P)\Phi x=\Phi\Psi_J\alpha$. Furthermore, by assumption, x is orthogonal to $\mathcal{R}(\Phi\Psi_J)$. Hence we may apply Theorem 2 to obtain $$\frac{|\langle(I-P)\Phi x, \Phi x\rangle|}{\|(I-P)\Phi x\|_2\|\Phi x\|_2} \le \frac{\delta}{1-\delta}.$$

Combining this with (16), we obtain $$\|(I-P)\Phi x\|_2 \le \frac{\delta}{1-\delta}\|\Phi x\|_2.$$

Since we trivially have that $\|(I-P)\Phi x\|_2 \ge 0$, we can combine this with (15) to obtain $$\left(1-\left(\frac{\delta}{1-\delta}\right)^2\right)\|\Phi x\|_2^2 \le \|P\Phi x\|_2^2 \le \|\Phi x\|_2^2.$$

Since $x\in S$, we have that $$\left(1-\left(\frac{\delta}{1-\delta}\right)^2\right)(1-\delta)\|x\|_2^2 \le \|P\Phi x\|_2^2 \le b\|x\|_2^2.$$

Corollary 1. Given an index set J with cardinality $\#J\le K_J$, let $\Phi_{J^c}$ denote the matrix consisting of the columns of $\Phi$ indexed by the set $J^c=\{1, 2, \ldots, N\}\backslash J$. If $\Phi$ satisfies the RIP of order $K=2K_S+K_J$, then $P\Phi_{J^c}$ satisfies $$\left(\frac{1-2\delta}{1-\delta}\right)\|\tilde{x}\|_2^2 \le \|P\Phi_{J^c}\tilde{x}\|_2^2 \le (1+\delta)\|\tilde{x}\|_2^2, \quad (17)$$

for all $\tilde{x}\in \mathbb{R}^{N-K_J}$ such that $\|\tilde{x}\|_0 \le 2K_S$.

One can easily verify that if δ≤0.314, then (17) is sufficient to ensure that the conditions for Theorem 1 are satisfied, and thus we conclude that under a slightly more restrictive bound on the required RIP constant, we can directly recover a sparse signal of interest $x_S$ that is orthogonal to the interfering $x_I$ without actually recovering $x_I$. We further note that in practice, these bounds and theorems are known to be very loose. While they provide a strong motivation for and validation of our preferred embodiment, these results should not indicate that we require that our measurement matrices satisfy the RIP or more generally that they are stable embeddings of our set of possible signals of interest.

However, the theoretical results do suggest that our approach to interference cancellation will have a number of practical benefits. For example, if we are interested in classification or parameter estimation based only on $x_S$, then we can use the tools described in the previous section to process the filter output. The performance of compressive domain inference and processing will be significantly improved by eliminating or attenuating the interference due to $x_I$.

There are also advantages if we are interested in signal recovery. For instance, if we attempt to first recover x and then cancel $x_I$, then we require the RIP of order $2(K_S+K_J)$ to ensure that this recover-then-cancel approach will be successful. In contrast, our filtering out $x_I$ followed by recovery of $x_S$ requires the RIP of order only $2K_S+K_J$. In certain cases (when $K_J$ is significantly larger than $K_S$), this results in a substantial decrease in the required number of measurements. Furthermore, since most recovery algorithms have computational complexity that is at least linear in the number of coefficients of the recovered signal, this can also result in substantial computational savings.

We also observe that it is a relatively straightforward corollary of Theorem 3 that if $\Phi$ is a δ-stable embedding of $(S,\Psi_J)$, then I−P is a stable embedding of $(\tilde{\Psi}_J, \{0\})$. Thus we could use the operator I−P to cancel interference that lives in or near an unknown subspace, provided that we already know the subspace in or near which our signal of interest resides.

We further emphasize that the general result indicates that if $\Phi$ is a stable embedding of $(S,\Psi_J)$, then P preserves the structure in S as much as is feasible. Thus, we are do not limit ourselves to the case where S represents sparse signals. S might represent a point cloud or a low-dimensional manifold or another structure. Furthermore, while this information preservation is of importance to the signal recovery problem, it also enables a wide variety of signal processing tasks including, but not limited to, estimation, detection, and classification.

Finally, we note that in many settings, an orthogonal projection may not be most appropriate. In the preferred embodiment described above, where we are attempting to remove or attenuate a signal that lives in or near a known subspace, our matrix P has $M^2$ degrees of freedom. However, the set of matrices that completely cancel out the interference can be described by only $MK_I$ equations. Thus, there are $M(M-K_I)$ unused degrees of freedom. In the discussion above we have set these remaining degrees of freedom to ensure that P is an orthogonal projection, but in some settings it may be desirable to add additional constraints instead. For example, if a signal of interest $x_S$ lives in or near a known subspace indexed by $J_S$ while an interfering signal $x_I$ lives in or near a different subspace indexed by $J_I$, where $K_S+K_I \leq M$, then we can use methods similar to those described above to design a matrix P so that $P\Phi_{J_I}=0$ and $P\Phi_{J_S}=\Phi_{J_S}$. This would ensure that the measurements corresponding to the signal of interest are not perturbed. In general, if B is a matrix of size $M \times J_S$ where $J_S \leq (M-K_I)$, we can design a matrix that cancels out the interference, i.e., that satisfies $P\Phi_{J_I}=0$, while ensuring that $P\Phi_{J_S}=B$. The choice of B will depend on the particular embodiment.

4.3 Reduction to Practice

In this section we demonstrate the performance of our new cancellation method in the context of attempting to recover a signal of interest $x_S$ while canceling out the interfering signal $x_I$. In this demonstration, we use the iterative CoSaMP greedy recovery algorithm, since it more naturally lends itself towards a simple modification described below. This is merely for the sake of simplicity; one could modify any recovery algorithm in a similar fashion.

More specifically, we compare three different interference cancellation approaches:

1. Cancel-then-recover: This is our newly invented method and apparatus. We cancel out the contribution of $x_I$ to the measurements y and directly recover $x_S$ using a recovery algorithm. In the particular examples presented below, we use the CoSaMP algorithm.
2. Modified recovery: Since we know the support of $x_I$, rather than cancelling out the contribution from $x_I$ to the measurements, we modify a greedy algorithm such as CoSaMP to exploit the fact that part of the support of x is known in advance. This modification is made simply by forcing CoSaMP to always keep the elements of J in the active set at each iteration. After recovering $\hat{x}$, we then set $\hat{x}_n=0$ for $n \in J$ to filter out the interference.
3. Recover-then-cancel: This is the naïve approach to interference rejection with CS measurements. We simply ignore that we know the support of $x_I$ and try to recover the signal x using a recovery algorithm (here the standard CoSaMP algorithm), and then set the $\hat{x}_n=0$ for $n \in J$ as in Approach 2.

In the demonstrations, we set N=1000, M=200, and $K_S$=10. We then considered a range of values of $K_I$ from 1 to 100. For each value of $K_1$, we generated 2000 test signals where the coefficients were selected according to a Gaussian distribution, and then contaminated with an N-dimensional Gaussian noise vector. As a reference for comparison, we also considered an impractical, idealized "oracle" decoder that knows the support of both $x_I$ and $x_S$ and solves the least-squares problem restricted to the known support set.

We considered a range of signal-to-noise ratios (SNRs), where $$SNR = 10\log_{10}\left(\frac{\text{Signal power}}{\text{Noise power}}\right),$$

and signal-to-interference ratios (SIRs), where $$SIR = 10\log_{10}\left(\frac{\text{Signal power}}{\text{Interference power}}\right).$$

FIG. 10 shows the results for the case where $x_S$ and $x_I$ are normalized to have equal energy (an SIR of 0 dB) and where the variance of the noise is selected so that the SNR is 15 dB. Our results were consistent for a wide range of SNR and SIR values, and we omit the plots due to space limitations.

Our results demonstrate that the cancel-then-recover approach performed significantly better than both of the other methods as $K_I$ grows larger than $K_S$. While both of the other methods begin to suffer as $K_I$ grows large, the cancel-then-recover approach continues to perform almost as well as the oracle decoder for the entire range of $K_I$. We also note that the while the modified recovery method did perform slightly better than the recover-then-cancel approach, the improvement is relatively minor.

We observe similar results in FIG. 11 for the time required to recover the signal of interest (which includes the cost of computing the matrix P in the cancel-then-recover approach), with the cancel-then-recover approach performing significantly faster than the other approaches as $K_I$ grows larger than $K_S$.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference in its entirety herein.

What is claimed is:

1. A method for removing or attenuating undesired components from a set of measurements while preserving information contained in the set of measurements concerning components of interest, the method comprising the steps of:
   obtaining compressive measurements of a signal, said signal comprising a signal of interest and interference, said signal of interest residing in or near a first set of signals and said interference residing in or near a second set of signals, wherein elements of said second set of signals are partially orthogonal to elements of said first set of signals; and
   processing said compressive measurements to eliminate or attenuate said interference.

2. A method for removing or attenuating undesired components from a set of compressive measurements while preserving information contained in the measurements concerning components of interest in accordance with claim 1, wherein said step of obtaining compressive measurements comprises a dimensionality reduction from a higher dimensional space to a lower dimensional space.

3. A method for removing or attenuating undesired components from a set of compressive measurements while preserving information contained in the measurements concerning components of interest in accordance with claim 1, wherein said step of obtaining compressive measurements comprises obtaining compressive measurements by a random or pseudorandom projection operator.

4. A method for removing or attenuating undesired components from a set of compressive measurements while preserving information contained in the measurements concerning components of interest in accordance with claim 1, wherein said step of obtaining compressive measurements comprises obtaining compressive measurements by a valid compressive sensing matrix.

5. A method for removing or attenuating undesired components from a set of compressive measurements while preserving information contained in the measurements concerning components of interest in accordance with claim 1, wherein said first set of signals is a union of subspaces and said second set is a subspace.

6. A method for removing or attenuating undesired components from a set of compressive measurements while preserving information contained in the measurements concerning components of interest in accordance with claim 5, wherein said subspace of said second set of signals is substantially orthogonal to said union of subspaces of said first set of signals.

7. A method for removing or attenuating undesired components from a set of compressive measurements while preserving information contained in the measurements concerning components of interest in accordance with claim 1, wherein said first set of signals is a subspace and said second set is a union of subspaces.

8. A method for removing or attenuating undesired components from a set of compressive measurements while preserving information contained in the measurements concerning components of interest in accordance with claim 1, wherein said first set of signals is a finite dictionary of signals and said second set of signals is a subspace.

9. A method for removing or attenuating undesired components from a set of compressive measurements while preserving information contained in the measurements concerning components of interest in accordance with claim 7, wherein said union of subspaces of said second set are substantially orthogonal to first subspace of said first set.

10. A method for removing or attenuating undesired components from a set of compressive measurements while preserving information contained in the measurements concerning components of interest in accordance with claim 1, wherein said first set of signals is a subspace and said second set of signals is a finite dictionary of signals.

11. A method for removing or attenuating undesired components from a set of compressive measurements while preserving information contained in the measurements concerning components of interest in accordance with claim 1, wherein said first set of signals follow a parametric model and said second set of signals is a subspace.

12. A method for removing or attenuating undesired components from a set of compressive measurements while preserving information contained in the measurements concerning components of interest in accordance with claim 1, wherein said first set of signals is a subspace and said second set of signals follows a parametric model.

13. A method for removing or attenuating undesired components from a set of compressive measurements while preserving information contained in the measurements concerning components of interest in accordance with claim 1, wherein said step of processing said compressive measurements to eliminate said interference comprises projecting the measurements onto a subspace.

14. A method for removing or attenuating undesired components from a set of compressive measurements while preserving information contained in the measurements concerning components of interest in accordance with claim 13, wherein said step of projecting the measurements is performed by applying a projection matrix to the measurements.

15. A method for removing or attenuating undesired components from a set of compressive measurements while preserving information contained in the measurements concerning components of interest in accordance with claim 13, wherein said step of projecting the measurements is performed via an iterative algorithm.

16. A method for removing or attenuating undesired components from a set of compressive measurements while preserving information contained in the measurements concerning components of interest in accordance with claim 1, wherein said step of processing said compressive measurements to eliminate said interference comprises processing the measurements so that they lie near a subspace.

17. A method for signal acquisition in the presence of interference, the method comprising the steps of:
   obtaining compressive measurements of a signal, said signal comprising a signal of interest and interference, said signal of interest residing in or near a first set of signals and said interference residing in or near a second set of signals, wherein elements of said second set are partially orthogonal to elements of said first set;
   processing said compressive measurements to eliminate or attenuate said interference; and
   reconstructing said signal of interference.

18. A method for detecting the presence or absence of a signal of interest in the presence of interference, the method comprising the steps of:
   obtaining compressive measurements of a signal, said signal comprising a signal of interest and interference, said signal of interest residing in or near a first set of signals and said interference residing in or near a second set of signals, wherein elements of said second set are partially orthogonal to elements of said first set;
   processing said compressive measurements to eliminate or attenuate said interference; and
   detecting the presence or absence of said signal of interest.

19. A method for classifying a signal of interest in the presence of interference, the method comprising the steps of:
   obtaining compressive measurements of a signal, said signal comprising a signal of interest and interference, said signal of interest residing in or near a first set of signals and said interference residing in or near a second set of signals, wherein elements of said second set are partially orthogonal to elements of said first set;
   processing said compressive measurements to eliminate or attenuate said interference; and classifying said signal of interest.

20. A method for estimating a function of a signal of interest in the presence of interference, the method comprising the steps of:
   obtaining compressive measurements of a signal, said signal comprising a signal of interest and interference, said signal of interest residing in or near a first set of signals and said interference residing in or near a second set of signals, wherein elements of said second set are partially orthogonal to elements of said first set;
   processing said compressive measurements to eliminate or attenuate said interference; and
   estimating the value of said function that is consistent with said processed measurements.

* * * * *